(12) United States Patent
Ohgoh

(10) Patent No.: US 7,366,216 B2
(45) Date of Patent: Apr. 29, 2008

(54) SEMICONDUCTOR LASER ELEMENT FORMED ON SUBSTRATE HAVING TILTED CRYSTAL ORIENTATION

(75) Inventor: Tsuyoshi Ohgoh, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 89 days.

(21) Appl. No.: 11/060,559

(22) Filed: Feb. 18, 2005

(65) Prior Publication Data

US 2005/0185687 A1   Aug. 25, 2005

(30) Foreign Application Priority Data

Feb. 19, 2004   (JP)   ............................. 2004-043135

(51) Int. Cl.
*H01S 5/00*   (2006.01)
(52) U.S. Cl. .............................. 372/44.011; 372/43.01; 372/46.01
(58) Field of Classification Search ............. 372/43.01, 372/44.011, 46.01
See application file for complete search history.

(56) References Cited

U.S. PATENT DOCUMENTS

| | | | |
|---|---|---|---|
| 4,974,231 A | | 11/1990 | Gomyo |
| 5,157,679 A | * | 10/1992 | Kondow et al. .......... 372/43.01 |
| 5,263,040 A | * | 11/1993 | Hayakawa ............. 372/45.011 |
| 5,465,266 A | * | 11/1995 | Bour et al. .............. 372/46.01 |
| 5,621,748 A | * | 4/1997 | Kondo et al. ............ 372/46.01 |
| 5,684,818 A | * | 11/1997 | Anayama et al. ........ 372/46.01 |
| 5,717,709 A | | 2/1998 | Sasaki et al. |
| 5,799,027 A | * | 8/1998 | Anayama et al. ........ 372/45.01 |
| 5,881,086 A | * | 3/1999 | Miyazawa ............. 372/46.014 |
| 6,134,368 A | * | 10/2000 | Sakata ........................ 385/131 |
| 6,219,365 B1 | | 4/2001 | Mawst et al. |
| 6,356,572 B1 | | 3/2002 | Tanaka et al. |
| 6,444,485 B1 | * | 9/2002 | Kidoguchi et al. ........... 438/31 |
| 6,614,059 B1 | * | 9/2003 | Tsujimura et al. .......... 257/101 |
| 6,653,248 B2 | * | 11/2003 | Kean et al. .................... 438/22 |
| 2002/0027935 A1 | | 3/2002 | Anayama |
| 2002/0149030 A1 | * | 10/2002 | Kean et al. ................. 257/191 |

(Continued)

FOREIGN PATENT DOCUMENTS

EP   0 325 275 A   7/1989

(Continued)

OTHER PUBLICATIONS

Toshiaki Fukunaga et al., "Highly Reliable Operation of High-Power InGaAsP/InGaP/AlGaAs 0.8 μm Separate Confinement Heterostructure Lasers", Japanese Journal of Applied Physics, vol. 34, No. 9B, pp. 1175-1177, 1995.

(Continued)

*Primary Examiner*—Minsun Oh Harvey
*Assistant Examiner*—Phillip Nguyen
(74) *Attorney, Agent, or Firm*—Sughrue Mion, PLLC

(57) ABSTRACT

A semiconductor laser element having a structure in which at least one AlGaInP or GaInP layer is formed above a GaAs substrate. The crystal orientation of the principal plane of the GaAs substrate is tilted from (100) toward (111). When the total thickness of the at least one AlGaInP or GaInP layer is 1 micrometer or smaller, the tilt angle of the crystal orientation of the principal face is 8 to 54.7 degrees. When the total thickness of the at least one AlGaInP or GaInP layer is 1 micrometer or greater, the tilt angle of the crystal orientation of the principal face is 13 to 54.7 degrees.

4 Claims, 3 Drawing Sheets

U.S. PATENT DOCUMENTS

2004/0041162 A1* 3/2004 Shimoyama et al. ......... 257/91

FOREIGN PATENT DOCUMENTS

EP        1 187 277 A2     3/2002

OTHER PUBLICATIONS

Hayakawa T:, "High reliability and facet temperature reduction in high-power 0.8 mulm A1 free active-region diode lasers", Proceedings of the SPIE—the International Society for Optical Engineering SPIE-Int. Soc. Opt. Eng USA, vol. 4287, 2001, pp. 103-110, XP002363361.

Earles T et al., "narrow spectral width (<1A FWHM) 1.1-W cw operation form 100-mulm stripe DFB diode lasers (lambda !=0.893 mulm) with A1-free optical-confinement region", Technical Digest Summaries of Papers Presented at the Conference on Lasers and Electro-Optics Conference Edition 1998 Technical Digest Series, vol. 6 (IEEE Cat. NO98CH36178) Opt. Soc. America Washington, DC, USA, 1998, pp. 38-39, XP002363362.

Kondo M et al: "Crystal Orientation Dependence of Impurity Dopant Incorporation in Movpe-Grown III-V Materials" Journal of Crystal Growth, Elsevier, Amsterdam, NL vol. 124, No. ¼, Nov. 1, 1992, pp. 449-456.

* cited by examiner

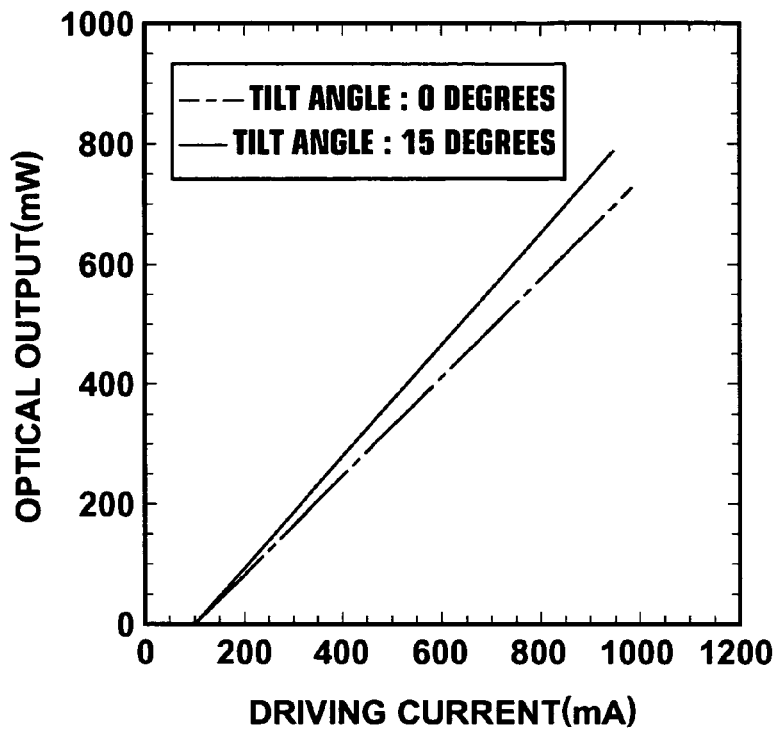
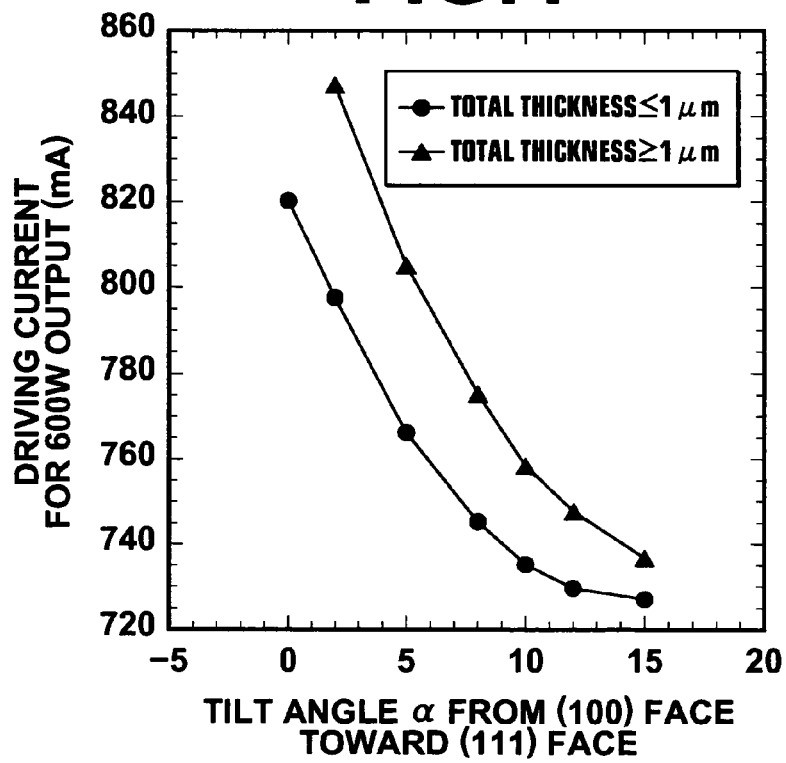

SEMICONDUCTOR LASER ELEMENT FORMED ON SUBSTRATE HAVING TILTED CRYSTAL ORIENTATION

BACKGROUND OF THE INVENTION

1. Field of the Invention

The present invention relates to a semiconductor laser element, and in particular to a semiconductor laser element (typically a laser diode) which has an oscillation wavelength of about 800 nm. Hereinafter, the laser diode may be referred to as an LD.

2. Description of the Related Art

Currently, the laser machining techniques are widely used in the shipbuilding, heavy industries, aerospace industries, and the like as well as the automobile industries and electronic manufacturing industries since the laser machining techniques have more advantages than the other machining techniques. For example, the laser machining techniques enable complex and fine machining, and do not impair the material strength.

Recently, the use of solid-state lasers using a semiconductor laser as an excitation light source (which are hereinafter referred to as LD-excited solid-state lasers) has been spreading. For example, in some Nd:YAG lasers which emit infrared light having a wavelength of 1,064 nm, 808-nm band GaAs/AlGaAs-based LDs are used as excitation light sources.

However, since the active layers in the GaAs/AlGaAs-based semiconductor laser elements contain aluminum, which is prone to oxidation, the characteristics of the semiconductor laser elements can suddenly deteriorate. According to a technique which has been proposed for overcoming this problem, a light-emission region is formed of a material which does not contain aluminum, and cladding layers are formed of AlGaAs in order to prevent deterioration of the temperature characteristics.

Specifically, rapid deterioration of the characteristics caused by oxidation of aluminum is prevented by forming an active layer of InGaAsP and optical waveguide layers of GaInP. In addition, the so-called separate-confinement heterostructure (SCH) is used. In the SCH, a carrier-confinement region and a light-confinement region are separately arranged. Thus, it is expected that a semiconductor laser having high optical density and being superior in output characteristics and reliability is obtained, as indicated in "Highly Reliable Operation of High-Power InGaAsP/InGaP/AlGaAs 0.8 µm Separate Confinement Heterostructure Lasers", T. Fukunaga et al., Japanese Journal of Applied Physics, vol. 34, No. 9B, pp. L1175-1177 (1995).

When the semiconductor laser element disclosed in the above document is produced, crystal defects can be produced in a GaInP layer during growth of a GaInP crystal on a GaAs layer by MOCVD (metal organic chemical vapor deposition). Similar crystal defects can also be produced in a AlGaInP layer, which is a similar type of material to GaInP. For example, it has been confirmed that elliptical hillocks are produced as crystal defects when a GaInP crystal is grown on a (100) face of a GaAs crystal.

Although the influence of the hillocks on the laser characteristics has not yet been sufficiently studied, it is considered that when an active layer of InGaAsP (which is a quaternary mixed crystal the composition of which is not easy to control) is formed on a GaInP layer having hillocks, the hillocks can affect the quality of the active layer.

SUMMARY OF THE INVENTION

The present invention has been developed in view of the above circumstances.

The object of the present invention is to provide a semiconductor laser element which has a GaInP layer containing a small number of crystal defects, exhibiting high performance, and having a long lifetime.

The present inventor has found that the degree of growth of two-dimensional nuclei on the surface of the optical waveguide layer depends on the crystal orientation of the principal plane of the GaAs substrate. Since the growth of two-dimensional nuclei causes hillocks, it is possible to improve the crystalline quality of the optical waveguide layer and the active layer formed on the optical waveguide layer when the degree of the growth of two-dimensional nuclei can be suppressed. The present invention is made based on the above findings.

(1) In order to accomplish the aforementioned object, the first aspect of the present invention is provided. According to the first aspect of the present invention, there is provided a semiconductor laser element comprising: a substrate of GaAs having a principal plane the crystal orientation of which is tilted 8 to 54.7 degrees from (100) toward (111); at least one layer of $(Al_aGa_{1-a})_{0.51}In_{0.49}P$ being formed above the principal plane of the substrate and having a total thickness of 1 micrometer or smaller, where $0 \leq a \leq 1$; and an active layer of $In_xGa_{1-x}As_{1-y}P_y$ formed above the at least one layer, where $x \approx 0.49y$ and $0 < y \leq 1.0$.

Preferably, the semiconductor laser element according to the first aspect of the present invention may also have one or any possible combination of the following additional features (i) to (iii).

(i) The semiconductor laser element according to the first aspect of the present invention may further comprise a cladding layer of $Al_bGa_{1-b}As$, where $0.57 \leq b \leq 0.8$, and one of the at least one layer may be an optical waveguide layer of $Ga_{0.51}In_{0.49}P$.

(ii) The active layer may be a strained active layer having a compressive or tensile strain, where $0 < x \leq 0.3$.

(iii) The semiconductor laser element according to the first aspect of the present invention may have an oscillation wavelength equal to or greater than 760 nm and smaller than 840 nm.

(2) In order to accomplish the aforementioned object, the second aspect of the present invention is provided. According to the second aspect of the present invention, there is provided a semiconductor laser element comprising: a substrate of GaAs having a principal plane the crystal orientation of which is tilted 13 to 54.7 degrees from (100) toward (111); at least one layer of $(Al_aGa_{1-a})_{0.51}In_{0.49}P$ being formed above the principal plane of the substrate and having a total thickness of 1 micrometer or greater, where $0 \leq a \leq 1$; and an active layer of $In_xGa_{1-x}As_{1-y}P_y$ formed above the at least one layer, where $x \approx 0.49y$ and $0 < y \leq 1.0$.

Preferably, the semiconductor laser element according to the second aspect of the present invention may also have one or any possible combination of the following additional features (iv) to (vi).

(iv) One of the at least one layer may be an optical waveguide layer of $Ga_{0.51}In_{0.49}P$, and another of the at least one layer may be a cladding layer of $(Al_cGa_{1-c})_{0.51}In_{0.49}P$, where $0.3 \leq c \leq 0.7$.

(v) The active layer may be a strained active layer having a compressive or tensile strain, and $0 < x \leq 0.3$.

(vi) The semiconductor laser element according to the second aspect of the present invention may have an oscillation wavelength equal to or greater than 760 nm and smaller than 840 nm.

In the semiconductor laser elements according to the first and second aspects of the present invention, a laser structure is formed on a GaAs substrate having a principal plane arranged in a predetermined crystal orientation. Therefore, the number of crystal defects in the AlGaInP layer or the GaInP layer which is formed on the GaAs substrate can be reduced, and thus it is possible to reduce the influence of the crystal defects on the active layer formed above the AlGaInP layer or the GaInP layer, and produce a semiconductor laser element which exhibits high performance and has high reliability.

Further, when the cladding layer is made of AlGaAs, which has a great bandgap, it is possible to prevent deterioration of the temperature characteristics and enhance the reliability of the semiconductor laser element. Furthermore, it is possible to achieve high output power when the active layer has a strain.

DESCRIPTION OF THE DRAWINGS

FIG. 3 is a graph indicating relationships between the crystal orientation of the principal plane of the GaAs substrate and the current-optical output characteristic.

FIG. 4 is a graph indicating relationships between the crystal orientation of the principal plane of the GaAs substrate and the driving current value.

DESCRIPTION OF PREFERRED EMBODIMENTS

Embodiments of the present invention are explained in detail below with reference to drawings.

First Embodiment

Figure 1:
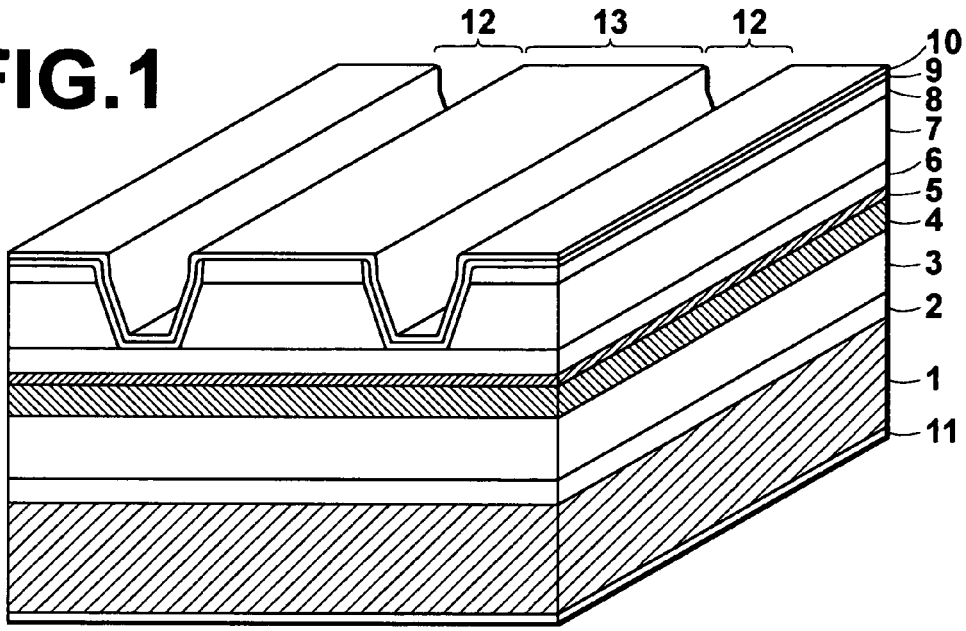
FIG. 1 is a schematic perspective view of a semiconductor laser element according to a first embodiment of the present invention.

FIG. 1 is a schematic perspective view of a semiconductor laser element according to the first embodiment of the present invention.

As illustrated in FIG. 1, the semiconductor laser element according to the first embodiment has a structure in which an n-type GaAs buffer layer 2 having a thickness of 0.2 micrometers, an n-type $Al_{z1}Ga_{1-z1}As$ lower cladding layer 3 ($0.57 \leq z1 \leq 0.8$) having a thickness of 2.0 micrometers, an n-type or i-type $Ga_{0.51}In_{0.49}P$ lower optical waveguide layer 4 having a thickness of 0.4 micrometers, an $In_xGa_{1-x}As_{1-y}P_y$ quantum-well active layer 5 ($x \approx 0.49y$ and $0 \leq x \leq 0.3$) having a thickness of 100 Angstroms, a p-type or i-type $Ga_{0.51}In_{0.49}P$ upper optical waveguide layer 6 having a thickness of 0.4 micrometers, a p-type $Al_{z1}Ga_{1-z1}As$ upper cladding layer 7 having a thickness of 2.0 micrometers, and a $p^+$-type GaAs contact layer 8 having a thickness of 0.2 micrometers are formed in this order on an n-type GaAs substrate 1. The crystal orientation of the principal plane of the GaAs substrate 1 is tilted 8 to 54.7 degrees from (100) toward (111)A, although the principal plane of the conventional substrate is a (100) face.

In addition, two stripe grooves 12 each having a width of about 10 micrometers are formed in the p-type $Al_{z1}Ga_{1-z1}As$ upper cladding layer 7 and the p-type GaAs contact layer 8 so that a ridge-shaped portion 13 having a width of about 50 micrometers is formed between the two stripe grooves 12. The surfaces of the ridge-shaped portion 13 except for the top surface are covered with an $SiO_2$ insulation film 9, and a p-side electrode 10 is formed on the top surface of the ridge-shaped portion 13. Further, an n-side electrode 11 is formed on the back surface of then-type GaAs substrate 1.

Next, a process for producing the semiconductor laser element illustrated in FIG. 1 is explained below.

First, an n-type GaAs wafer substrate having a principal plane the crystal orientation of which is tilted 8 to 54.7 degrees from (100) toward (111)A is prepared. Then, a first GaAs film for realizing the n-type GaAs buffer layer 2, a first AlGaAs film realizing the n-type $Al_{z1}Ga_{1-z1}As$ lower cladding layer 3, a first GaInP film realizing the n-type or i-type $Ga_{0.51}In_{0.49}P$ lower optical waveguide layer 4, an InGaAsP film realizing the $In_xGa_{1-x}As_{1-y}P_y$ quantum-well active layer 5, a second GaInP film realizing the p-type or i-type $Ga_{0.51}In_{0.49}P$ upper optical waveguide layer 6, a second AlGaAs film realizing the p-type $Al_{z1}Ga_{1-z1}As$ upper cladding layer 7, and a second GaAs film for realizing the $p^+$-type GaAs contact layer 8 are formed in this order on the n-type GaAs wafer substrate by organometallic chemical vapor deposition.

Subsequently, portions of the second GaAs film and the second AlGaAs film are removed by photolithography and chemical etching using a sulfuric acid-based etchant so as to form the aforementioned two stripe grooves 12 and the ridge-shaped portion 13 between the stripe grooves 12.

Thereafter, the $SiO_2$ insulation film 9 is formed by plasma CVD, and a portion of the $SiO_2$ insulation film 9 located on the top of the ridge-shaped portion 13 is removed by photolithography and etching using a diluted fluoric acid. Then, a Ti/Pt/Au electrode is formed as the p-side electrode 10 by evaporation and heat treatment. In addition, the back side of the n-type GaAs substrate 1 is polished until the total thickness becomes about 100 micrometers, and an Au/Ge/Ni/Au electrode is formed as the n-side electrode 11 by evaporation and heat treatment.

Finally, laser bars realizing the resonator length of about 0.75 to 1.5 mm are cut out from the wafer substrate processed as above by cleavage. Subsequently, the opposite cleaved faces of each laser bar are coated with a low-reflectance film and a high-reflectance film, respectively. Thereafter, each laser bar is divided into chips by cleavage. Thus, the semiconductor laser element illustrated in FIG. 1 is completed.

Tilt Angle of Principal Plane

The crystal orientation of the principal plane of the n-type GaAs substrate 1 is tilted by the tilt angle α from (100) toward (111)A as illustrated in FIG. 1, and the aforementioned layers including the n-type GaAs buffer layer 2 are laminated on such a principal plane. The present inventor has investigated the influence of the above tilt angle α on the crystalline quality of the at least one layer of $(Al_aGa_{1-a})_{0.51}In_{0.49}P$ ($0 \leq a \leq 1$) and the laser characteristics, and found a preferable range of the tilt angle α.

First, in order to investigate the influence of the above tilt angle α on the crystalline quality of the n-type or i-type GaInP lower optical waveguide layer 4, the present inventor has formed the laser structure illustrated in FIG. 1 on each of a plurality of GaAs substrates respectively having differently oriented principal planes, and compared the laser characteristics by using the photoluminescence (PL) technique. In the measurement, the precision of the tilt angles α of the crystal orientations of the plurality of GaAs substrates is ±0.3 degrees (from the (100) face toward the (111)A face).

Figure 2:
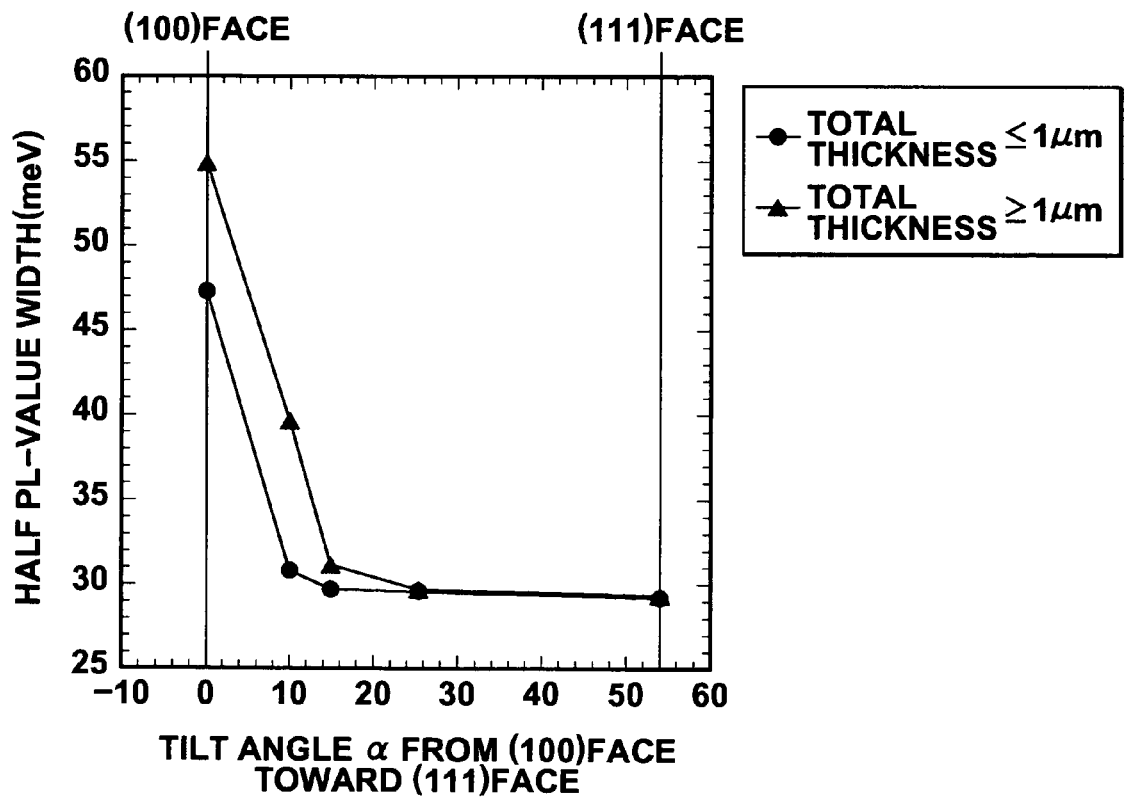
FIG. 2 is a graph indicating relationships between the crystal orientation of the principal plane of a GaAs substrate and the crystalline quality.

FIG. 2 is a graph indicating results of the above measurement using the photoluminescence (PL) technique. In the graph of FIG. 2, the abscissa corresponds to the tilt angle α, and the ordinate corresponds to the half-PL-value width (the half-value width of a photoluminescence peak). According to the measurement by the PL technique, the half-PL-value width increases with deterioration in the crystalline quality. Therefore, it is possible to evaluate the degree of defectiveness of the crystal by measuring the half-PL-value width.

The results of the above measurement are indicated in FIG. 2 as measurement results in the case where the total thickness of all of GaInP or AlGaInP layers located between the GaAs substrate and the active layer is one micrometer or smaller. In the first embodiment, since the GaInP or AlGaInP layers located between the GaAs substrate and the active layer is only the GaInP lower optical waveguide layer 4, the above total thickness is the thickness of the GaInP lower optical waveguide layer 4.

As indicated in FIG. 2, the present inventor has evaluated the crystalline quality in each of the examples in which the total thickness is one micrometer or smaller and the examples in which the total thickness is one micrometer or greater. The measurement results in the latter examples are explained later.

As indicated in FIG. 2, the measurement results in the examples in which the total thickness of all of GaInP or AlGaInP layers located between the GaAs substrate and the active layer is one micrometer or smaller (specifically, 0.4 micrometers) are as follows. That is, the half-PL-value width is about 48, 33, or 31 meV when the tilt angle α is 0, 8, or 10, respectively. In addition, the half-PL-value width is about 30 meV when the tilt angle α is in the range of 15 to 54.7 degrees. The principal plane of the GaAs substrate is a (100) face when the tilt angle α is 0 degrees, and the principal plane of the GaAs substrate is a (111)A face when the tilt angle α is 54.7 degrees.

The above measurement results show that the growth of two-dimensional nuclei which causes the hillocks is more strongly suppressed when the tilt angle α is greater. The present inventor has confirmed that satisfactory crystalline quality is obtained when the tilt angle α is about 8 degrees, although the effect of suppressing the growth of two-dimensional nuclei reaches the maximum when the tilt angle α is about 10 degrees.

Next, in order to confirm whether the effect of suppressing the growth of two-dimensional nuclei depending on the tilt angle α occurs in the GaInP lower optical waveguide layer 4 or in the InGaAsP quantum-well active layer 5, the present inventor have formed an InGaAsP monolayer film having a thickness of 0.5 micrometers on each of a plurality of GaAs substrates respectively having differently oriented principal planes, and performed similar measurement by using the photoluminescence (PL) technique. In the measurement, no variation with the tilt angle α is observed in the half-PL-value width in the structures in which the InGaAsP monolayer film is directly formed on the GaAs substrate. Therefore, it is possible to consider that the crystal orientation of the principal plane of the n-type GaAs substrate 1 does not directly affect the crystalline quality of the InGaAsP quantum-well active layer 5. In other words, it is possible to consider that the crystal orientation of the principal plane of the n-type GaAs substrate 1 affects the crystalline quality of the GaInP lower optical waveguide layer 4, and the crystalline quality of the GaInP lower optical waveguide layer 4 affects the crystalline quality of the InGaAsP quantum-well active layer 5.

In addition, in order to investigate the influence of the tilt angle α on the laser characteristics, the present inventor have measured the current-optical output characteristic of the laser structure of FIG. 1 which is formed on each of a GaAs substrate having the tilt angle α of 0 degrees and a GaAs substrate having the tilt angle α of 15 degrees. FIG. 3 shows the results of the measurement, where the abscissa corresponds to the driving current of the laser, and the ordinate corresponds to the optical output power of the laser. As indicated in the graph of FIG. 3, the efficiency is increased by about 10% by tilting the crystal orientation of the principal plane of the GaAs substrate 15 degrees from (100) toward (111).

Further, the present inventor have measured the current-optical output characteristic of the laser structure of FIG. 1 which is formed on each of GaAs substrates respectively having the tilt angles α of 2, 5, 8, 10, and 12 degrees. The results of the above measurement is indicated in FIG. 4 as relationships between the tilt angles α (abscissa) and the driving currents necessary for achieving the optical output power of 600 mW (ordinate) in the case where the total thickness of all of GaInP or AlGaInP layers located between the GaAs substrate and the active layer is one micrometer or smaller. Although FIG. 4 also shows relationships in the case where the total thickness is one micrometer or greater, the relationships in this case are explained later.

As indicated in FIG. 4, the results of the above measurement in the case where the total thickness of all of GaInP or AlGaInP layers located between the GaAs substrate and the active layer is one micrometer or smaller show that the driving current necessary for achieving the optical output power of 600 mW is about 820 mA when the tilt angle α is 0 degrees, is slightly smaller than 800 mA when the tilt angle α is 2 degrees, and is about 765, 745, 735, 730, or 725 mA when the tilt angle α is 5, 8, 10, 12, or 15 degrees, respectively. That is, the measurement results show that the driving current decreases with the increase in the tilt angle α. In other words, when the tilt angle α is increased, the crystalline quality (PL characteristic) of the GaInP optical waveguide layer and the laser characteristics are improved.

Hereinbelow, semiconductor laser elements in which the total thickness of all of GaInP or AlGaInP layers located between the GaAs substrate and the active layer is one micrometer or greater are explained with reference to FIGS. 2 and 4. In order to investigate the influence of the total thickness of the at least one layer of $(Al_aGa_{1-a})_{0.51}In_{0.49}P$ ($0 \leq a \leq 1$) on the crystalline quality of the InGaAsP quantum-well active layer 5, the present inventor has formed a laser structure similar to the structure illustrated in FIG. 1 on each of a plurality of GaAs substrates respectively having differently oriented principal planes, and measured the half-PL-value width and the driving current necessary for achieving the optical output power of 600 mW in each of the semiconductor laser elements in a similar manner to the case where the total thickness of the at least one layer of $(Al_aGa_{1-a})_{0.51}In_{0.49}P$ ($0 \leq a \leq 1$) located between the GaAs substrate and the active layer is one micrometer or smaller. In the above laser structure, the lower cladding layer 3 is made of $(Al0.5Ga0.5)_{0.51}In_{0.49}P$ and has a thickness of 2.0 micrometers, and the lower optical waveguide layer is made of GaInP and has a thickness of 0.4 micrometers. The results of the above measurement are indicated in FIGS. 2 and 4 as relationships in the case where the total thickness of the at least one layer of $(Al_aGa_{1-a})_{0.51}In_{0.49}P$ ($0 \leq a \leq 1$) located between the GaAs substrate and the active layer is one micrometer or greater.

As indicated in FIG. 2, in the case where the total thickness of the at least one layer of $(Al_aGa_{1-a})_{0.51}In_{0.49}P$ ($0 \leq a \leq 1$) located between the GaAs substrate and the active layer is one micrometer or greater, the half-PL-value width is about 55, 40, or 31 meV when the tilt angle α is 0, 10, or 15 degrees, respectively. In addition, the half-PL-value width is about 30 meV when the tilt angle α is in the range of 25 to 54.7 degrees. As mentioned before, the principal plane of the GaAs substrate is a (111)A face when the tilt angle α is 54.7 degrees.

The above measurement results show that when the total thickness of the at least one layer of $(Al_aGa_{1-a})_{0.51}In_{0.49}P$ (023 $a \leq 1$) located between the GaAs substrate and the active layer is one micrometer or greater, the tilt angle α at which the effect of suppressing the growth of two-dimensional nuclei reaches its maximum increases. Since the number of the two-dimensional nuclei contained in an entire film increases with the thickness of the film, it is considered that a greater tilt angle α is necessary for suppressing the growth of two-dimensional nuclei when the total thickness of the at least one layer of $(Al_aGa_{1-a})_{0.51}In_{0.49}P$ ($0 \leq a \leq 1$) located between the GaAs substrate and the active layer is increased. Although the effect of suppressing the growth of two-dimensional nuclei is maximized at the tilt angle α of 25 degrees, the present inventor has confirmed that the crystalline quality is satisfactory even when the tilt angle α is around 13 degrees.

In addition, as indicated in FIG. 4, the results of the above measurement show that the driving current necessary for achieving the optical output power of 600 mW is about 845, 805, 775, 755, 745, or 735 mA when the tilt angle α is 2, 5, 8, 10, 12, or 15 degrees, respectively. That is, as in the case where the total thickness of all of GaInP or AlGaInP layers located between the GaAs substrate and the active layer is one micrometer or smaller, the efficiency in the laser structure increases with the tilt angle α of the crystal orientation of the principal plane of the GaAs substrate. However, the tilt angle α necessary for achieving a certain level of performance (laser characteristics) in the case where the total thickness of the at least one layer of $(Al_aGa_{1-a})_{0.51}In_{0.49}P$ ($0 \leq a \leq 1$) located between the GaAs substrate and the active layer is one micrometer or greater is greater than the tilt angle α necessary for achieving the same level of performance in the case where the total thickness of the at least one layer of $(Al_aGa_{1-a})_{0.51}In_{0.49}P$ ($0 \leq a \leq 1$) located between the GaAs substrate and the active layer is one micrometer or smaller.

Based on the above measurement results, the present inventor has reached the following conclusion. That is, it is preferable to form a laser structure on a GaAs substrate, where the crystal orientation of the principal plane is tilted 8 to 54.7 degrees from (100) toward (111) in the case where the total thickness of the at least one layer of $(Al_aGa_{1-a})_{0.51}In_{0.49}P$ ($0 \leq a \leq 1$) located between the GaAs substrate and the active layer is one micrometer or smaller, or tilted 13 to 54.7 degrees from (100) toward (111) in the case where the total thickness of the at least one layer of $(Al_aGa_{1-a})_{0.51}In_{0.49}P$ ($0 \leq a \leq 1$) located between the GaAs substrate and the active layer is one micrometer or greater. Thus, the crystalline quality of the at least one layer of $(Al_aGa_{1-a})_{0.51}In_{0.49}P$ ($0 \leq a \leq 1$) in and the output characteristics of each of the semiconductor laser elements according to the first and second aspects of the present invention are satisfactory, and therefore it is possible to construct a high-performance, long-life semiconductor laser system by using the semiconductor laser element according to the first or second aspect of the present invention.

Second Embodiment

The present invention is not limited to the laser structure illustrated in FIG. 1, and can be any semiconductor laser elements having a structure in which either or both of AlGaInP and GaInP layers are formed between a GaAs substrate and an active layer.

Figure 5:
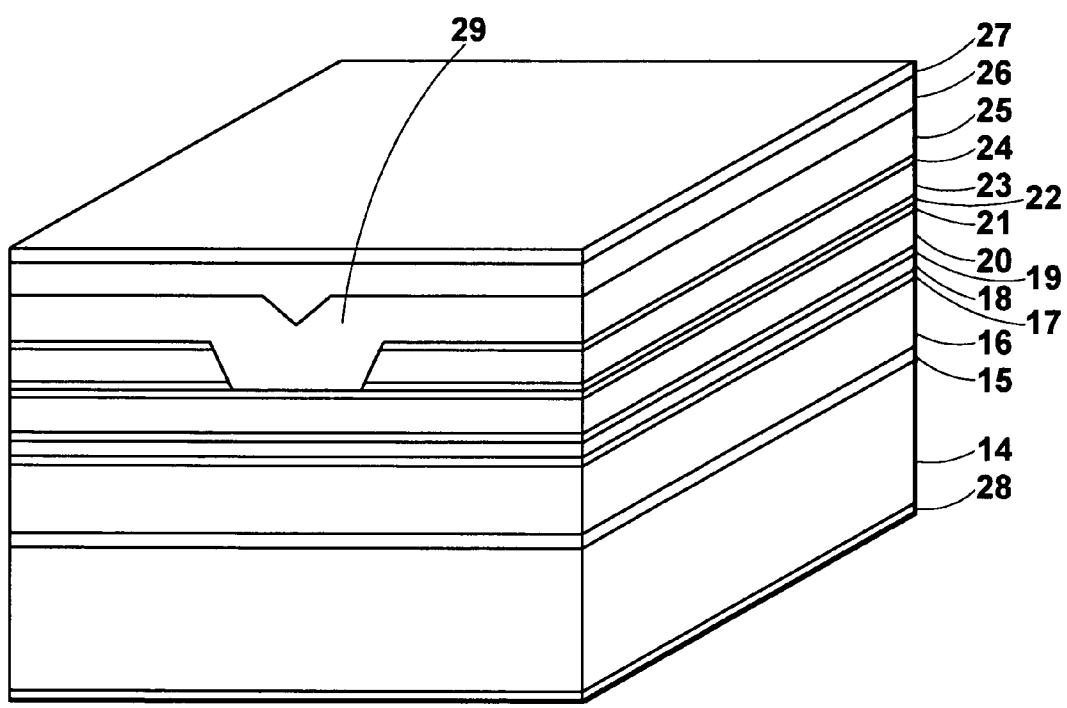
FIG. 5 is a schematic perspective view of a semiconductor laser element according to a second embodiment of the present invention.

FIG. 5 is a schematic perspective view of a semiconductor laser element according to the second embodiment of the present invention. According to the second embodiment, the following laser structure is formed on an n-type GaAs substrate 14 having a principal plane the crystal orientation of which is tilted 8 to 54.7 degrees from (100) toward (111)A.

As illustrated in FIG. 5, in the semiconductor laser element according to the second embodiment, an n-type GaAs buffer layer 15, an n-type $Al_{z1}Ga_{1-z1}As$ lower cladding layer 16 ($0.57 \leq z1 \leq 0.8$), an n-type or i-type $Ga_{0.51}In_{0.49}P$ lower optical waveguide layer 17, an $In_xGa_{1-x}As_{1-y}P_y$ quantum-well active layer 18 ($x \approx 0.49y$ and $0 \leq x \leq 0.3$), a p-type or i-type $Ga_{0.51}In_{0.49}P$ upper optical waveguide layer 19, a p-type $Al_{z2}Ga_{1-z2}As$ first upper cladding layer 20, and a p-type $Ga_{0.51}In_{0.49}P$ first etching-stop layer 21 having a thickness of 10 nm are formed in this order on the n-type GaAs substrate 14.

In addition, a p-type GaAs second etching-stop layer 22 having a thickness of 10 nm, an n-type $(Al_{z4}Ga_{1-z4})_{0.51}In_{0.49}P$ current-blocking layer 23 ($0.15 \leq z4 \leq 1$) having a thickness of 1,000 to 6,000 Angstroms, an n-type $Ga_{0.51}In_{0.49}P$ first cap layer 24 having a thickness of 10 nm, and a p-type $Ga_{1-z3}Al_{z3}As$ second upper cladding layer 25 are formed on the p-type $Ga_{0.51}In_{0.49}P$ first upper cladding layer 21. A stripe groove 29 having a width of 1 to 4 micrometers is formed through the n-type $Ga_{0.51}In_{0.49}P$ first cap layer 24, the n-type $(Al_{z4}Ga_{1-z4})_{0.51}In_{0.49}P$ current-blocking layer 23, and the p-type GaAs second etching-stop layer 22, and filled with the p-type $Ga_{1-z3}Al_{z3}As$ second upper cladding layer 25, which covers the n-type $Ga_{0.51}In_{0.49}P$ first cap layer 24. Further, a p-type GaAs contact layer 26 is formed over the p-type $Ga_{1-z3}Al_{z3}As$ second upper cladding layer 25.

In the above construction, the p-type Alz2Ga1-z2As first upper cladding layer 20 and the n-type $(Al_{z4}Ga_{1-z4})_{0.51}In_{0.49}P$ current-blocking layer 23 are arranged to have such composition and a thickness that oscillation in a fundamental transverse mode can be maintained even when the semiconductor laser element operates with high output power, and specifically the difference in the equivalent refractive index between the portion of the active layer under the stripe groove 29 and the other portions of the active layer is $1.5 \times 10^{-3}$ to $7.0 \times 10^{-3}$.

An n-side electrode 28 is formed on the back surface of the n-type GaAs substrate 13, and a p-side electrode 27 is formed on the p-type GaAs contact layer 26.

Next, a process for producing the semiconductor laser element illustrated in FIG. 5 is explained below.

First, an n-type GaAs wafer substrate having a principal plane the crystal orientation of which is tilted 8 to 54.7 degrees from (100) toward (111)A is prepared. Then, a first GaAs film for realizing the n-type GaAs buffer layer 15, a first AlGaAs film realizing the n-type $Al_{z1}Ga_{1-z1}As$ lower cladding layer 16, a first GaInP film realizing the n-type or i-type $Ga_{0.51}In_{0.49}P$ lower optical waveguide layer 17, an InGaAsP film realizing the $In_xGa_{1-x}As_{1-y}P_y$ quantum-well active layer 18, a second GaInP film realizing the p-type or i-type $Ga_{0.51}In_{0.49}P$ upper optical waveguide layer 19, a second AlGaAs film realizing the p-type Alz2Ga1-z2As first upper cladding layer 20, a third GaInP film realizing the p-type $Ga_{0.51}In_{0.49}P$ first etching-stop layer 21, a second GaAs film realizing the p-type GaAs second etching-stop layer 22, an AlGaInP film realizing the n-type $(Al_{z4}Ga_{1-z4})_{0.51}In_{0.49}P$ current-blocking layer 23, a fourth GaInP film realizing the n-type $Ga_{0.51}In_{0.49}P$ first cap layer 24, and a third GaAs film having a thickness of 10 nm and realizing an n-type GaAs second cap layer (not shown) are formed in this order on the n-type GaAs wafer substrate by organometallic chemical vapor deposition.

Next, a $SiO_2$ film (not shown) is formed over the n-type GaAs second cap layer, and a stripe area of the $SiO_2$ film corresponding to the stripe groove 29 is removed by photolithography, so that a stripe area of the n-type GaAs second cap layer is exposed. Subsequently, the exposed stripe area of the n-type GaAs second cap layer is etched off with a sulfuric acid-based etchant by using the $SiO_2$ film as a mask until a stripe area of the n-type GaInP first cap layer 24 is exposed. Then, the remaining areas of the $SiO_2$ film are removed by using a fluoric acid-based etchant, and the exposed stripe area of the n-type GaInP first cap layer 24 and a stripe area of the n-type AlGaInP current-blocking layer 23 are etched off with a hydrochloric acid-based etchant by using the remaining portions of the n-type GaAs second cap layer as a mask until the stripe groove 29 having the width of 1 to 4 micrometers is formed, and a stripe area of the p-type GaAs second etching-stop layer 22 is exposed at the bottom of the stripe groove 29.

Thereafter, the exposed stripe area of the p-type GaAs second etching-stop layer 22 and the remaining portions of the n-type GaAs second cap layer are removed by etching with a sulfuric acid-based etchant. Then, the p-type $Ga_{1-z3}Al_{z3}As$ second upper cladding layer 25 and the p-type GaAs contact layer 26 are formed as described before.

Further, a Ti/Pt/Au electrode is formed as the p-side electrode 27 by evaporation and heat treatment. In addition, the back side of the n-type GaAs substrate 14 is polished until the total thickness becomes about 100 micrometers, and an Au/Ge/Ni/Au electrode is formed as the n-side electrode 28 by evaporation and heat treatment.

Finally, laser bars realizing the resonator length of about 0.75 to 1.5 mm are cut out from the wafer substrate processed as above by cleavage. Subsequently, the opposite cleaved faces of each laser bar are coated with a low-reflectance film and a high-reflectance film, respectively. Thereafter, each laser bar is divided into chips by cleavage. Thus, the semiconductor laser element illustrated in FIG. 5 is completed.

Although the semiconductor laser element illustrated in FIG. 5 is different from the semiconductor laser element illustrated in FIG. 1 in the construction and the production process, in both of the semiconductor laser elements of FIGS. 1 and 5, at least one layer of $(Al_aGa_{1-a})_{0.51}In_{0.49}P$ ($0 \leq a \leq 1$) is arranged between a GaAs substrate and an active layer. As mentioned before, the present invention can be applied to any semiconductor laser elements in which at least one layer of $(Al_aGa_{1-a})_{0.51}In_{0.49}P$ ($0 \leq a \leq 1$) is arranged between a GaAs substrate and an active layer.

Variations and Additional Matters (i) The present invention can be applied to index-guided semiconductor laser elements which have a wide stripe region with a width of 4 micrometers or greater so as to reduce noise and oscillate in multiple modes. For example, such index-guided semiconductor laser elements may have a similar structure to the semiconductor laser element of FIG. 5 except for the width of the stripe region. In this case, it is possible to arrange such index-guided semiconductor laser elements so that the difference in the equivalent refractive index between the portion of the active layer under the stripe region and the other portions of the active layer is $1.5 \times 10^{-3}$ or greater. Further, the present invention can be applied to gain-guided stripe type semiconductor lasers, semiconductor lasers having a diffraction grating, bar-shaped one-dimensionally-arrayed lasers, and two-dimensionally-arrayed lasers.

(ii) The active layers may be a strained active layer having a compressive or tensile strain. However, in order to avoid the miscibility gap (i.e., the range of composition in which the spinodal decomposition occurs), it is preferable that the composition of the active layer is $In_xGa_{1-x}As_{1-y}P_y$ ($0 < x \leq 0.3$)

(iii) The active layer may be a multiple quantum-well (MQW) in which quantum-well sublayers and barrier sublayers are alternately laminated, where each of the quantum-well sublayers and the barrier sublayers is a thin film. When the barrier sublayers are made of the same material as the optical waveguide layers (i.e., GaInP or AlGaInP), one of the barrier sublayers is located between the quantum-well sublayers and the GaAs substrate. Therefore, the present invention is effective.

(iv) The examples of the composition of the GaInP or AlGaInP materials indicated in the above explanations are chosen so as to lattice-match with the GaAs substrate. However, the composition of the GaInP or AlGaInP materials is not limited to such examples. Further, it is unnecessary to limit the composition of the GaInP or AlGaInP materials so as to lattice-match with the GaAs substrate, as far as the thickness of each layer does not reach the critical thickness.

(v) It is possible to invert the conductivity types of all of the layers in the constructions of the first and second embodiments. Even when the conductivity types are inverted, the present invention is similarly effective. Therefore, semiconductor laser elements having the inverted conductivity types are also included within the scope of the present invention.

(vi) Although the crystal orientation of the principal plane of the GaAs substrate is indicated with respect to the (000) face and (111)A face, the present invention is equally effective even when the principal plane of the GaAs substrate is oriented in the crystallographically equivalent orientation.

(vii) The present invention can be applied to the multiple-transverse-mode lasers and the fundamental-transverse-mode lasers.

(viii) When the semiconductor laser element according to the first or second aspect of the present invention is used, it is possible to construct a high-power semiconductor laser system having an oscillation wavelength equal to or greater than 760 nm and smaller than 840 nm. The lasers in this wavelength range can be used in various fields such as laser beam machining, image processing, communications, laser measurement, medicine, and printing. That is, the present invention is highly usable.

(ix) In addition, all of the contents of the Japanese patent application No. 2004-043135 are incorporated into this specification by reference.

What is claimed is:

1. A semiconductor laser element comprising:
a substrate of GaAs having a principal plane which has a crystal orientation tilted 8 to 54.7 degrees from (100) toward (111);
at least one layer of $(Al_aGa_{1-a})_{0.51}In_{0.49}P$ being formed above said principal plane of said substrate and having a total thickness of 1 micrometer or smaller, where $0 \leq a \leq 1$; and
an active layer of $In_xGa_{1-x}As_{1-y}P_y$ formed above said at least one layer, where $x \approx 0.49y$ and $0<y<1$,
wherein said semiconductor laser element has an oscillation wavelength equal to or greater than 760 nm and smaller than 840 nm.

2. A semiconductor laser element comprising:
a substrate of GaAs having a principal plane which has a crystal orientation tilted 8 to 54.7 degrees from (100) toward (111);
at least one layer of $(Al_aGa_{1-a})_{0.51}In_{0.49}P$ being formed above said principal plane of said substrate and having a total thickness of 1 micrometer or smaller, where $0 \leq a \leq 1$;
an active layer of $In_xGa_{1-x}As_{1-y}P_y$ formed above said at least one layer, where $x \approx 0.49y$ and $0<y<1$; and
a cladding layer of $Al_bGa_{1-b}As$, where $0.57 \leq b \leq 0.8$, and one of said at least one layer is an optical waveguide layer of $Ga_{0.51}In_{0.49}P$.

3. A semiconductor laser element comprising:
a substrate of GaAs having a principal plane which has a crystal orientation tilted 13 to 54.7 degrees from (100) toward (111);
at least one layer of $(Al_aGa_{1-a})_{0.51}In_{0.49}P$ being formed above said principal plane of said substrate and having a total thickness of 1 micrometer or greater, where $0 \leq a \leq 1$; and
an active layer of $In_xGa_{1-x}As_{1-y}P_y$ formed above said at least one layer, where $x \approx 0.49y$ and $0<y<1$,
wherein said semiconductor laser element has an oscillation wavelength equal to or greater than 760 nm and smaller than 840 nm.

4. A semiconductor laser element comprising:
a substrate of GaAs having a principal plane which has a crystal orientation tilted 13 to 54.7 degrees from (100) toward (111);
at least one layer of $(Al_aGa_{1-a})_{0.51}In_{0.49}P$ being formed above said principal plane of said substrate and having a total thickness of 1 micrometer or greater, where $0 \leq a \leq 1$; and
an active layer of $In_xGa_{1-x}As_{1-y}P_y$ formed above said at least one layer, where $x \approx 0.49y$ and $0<y<1$, wherein one of said at least one layer is an optical wavelength layer of $Ga_{0.51}In_{0.49}P$, and another of said at least one layer is a cladding layer of $(Al_cGa_{1-c})_{0.51}In_{0.49}P$, and $0.3 \leq c \leq 0.7$.

* * * * *